(12) United States Patent
Schiemann et al.

(10) Patent No.: US 10,527,655 B2
(45) Date of Patent: Jan. 7, 2020

(54) OVERLOAD MONITORING DEVICE AND METHOD FOR OVERLOAD MONITORING

(71) Applicant: Robert Bosch GmbH, Stuttgart (DE)

(72) Inventors: Werner Schiemann, Fellbach (DE); Ralph Weinmann, Gerlingen (DE); Joachim Joos, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 171 days.

(21) Appl. No.: 15/111,956

(22) PCT Filed: Nov. 27, 2014

(86) PCT No.: PCT/EP2014/075770
§ 371 (c)(1),
(2) Date: Jul. 15, 2016

(87) PCT Pub. No.: WO2015/106869
PCT Pub. Date: Jul. 23, 2015

(65) Prior Publication Data
US 2016/0356827 A1 Dec. 8, 2016

(30) Foreign Application Priority Data
Jan. 20, 2014 (DE) .................. 10 2014 200 946

(51) Int. Cl.
*G01R 19/165* (2006.01)
*H02H 3/42* (2006.01)
(Continued)

(52) U.S. Cl.
CPC ..... *G01R 19/16528* (2013.01); *H02H 1/0007* (2013.01); *H02H 3/08* (2013.01); *H02H 3/38* (2013.01); *H02H 3/42* (2013.01)

(58) Field of Classification Search
CPC .... G01R 19/16528; H02H 3/08; H02H 3/087; H02H 3/20; H02H 3/38; H02H 3/40; H02H 3/42; H02H 3/44
See application file for complete search history.

(56) References Cited

U.S. PATENT DOCUMENTS

| 2010/0156649 | A1 | 6/2010 | Deaver, Sr. et al. | |
| 2010/0165521 | A1* | 7/2010 | Changali | H02H 1/0015 361/42 |
| 2012/0134062 | A1* | 5/2012 | Wortberg | H02H 3/0935 361/87 |

FOREIGN PATENT DOCUMENTS

| DE | 3842921 A1 | 6/1990 |
| DE | 4142471 A1 | 7/1992 |

(Continued)

OTHER PUBLICATIONS

International Search Report dated Feb. 25, 2015, of the corresponding International Application PCT/EP2014/075770, filed on Nov. 27, 2014.

*Primary Examiner* — Thienvu V Tran
*Assistant Examiner* — Christopher J Clark
(74) *Attorney, Agent, or Firm* — Norton Rose Fulbright US LLP; Gerard Messina

(57) ABSTRACT

An overload monitoring device for an electrical system including a measuring device for current and/or voltage, a time measuring device and an evaluation device connected to the measuring device and the time measuring device being provided, the evaluation device being designed for generating parameters from measured values of the measuring device and/or for detecting an overload situation based on the measured values and/or the parameters using time data of the time measuring device. A method for overload monitoring of an electrical system is also described, measured values being determined for a current and/or a voltage (Continued)

of the electrical system; time data being determined; parameters based on the measured values being generated; and an overload situation being detected based on the measured values and/or the parameters using the time data.

9 Claims, 5 Drawing Sheets

(51) Int. Cl.
    *H02H 3/08*     (2006.01)
    *H02H 3/38*     (2006.01)
    *H02H 1/00*     (2006.01)

(56) References Cited

FOREIGN PATENT DOCUMENTS

| | | |
|---|---:|---:|
| DE | 4111831 A1 | 10/1992 |
| DE | 19727825 A1 | 1/1999 |
| DE | 102006019467 | 10/2007 |
| DE | 102008064393 A1 | 7/2010 |
| DE | 102009027387 | 1/2011 |
| EP | 0200946 A1 | 11/1986 |
| EP | 1384300 A1 | 1/2004 |
| JP | 2004178883 A | 6/2004 |
| JP | 2007143209 A | 6/2007 |
| JP | 2007259626 A | 10/2007 |
| WO | WO0201693 | 1/2002 |
| WO | 2013187616 A1 | 12/2013 |

\* cited by examiner

OVERLOAD MONITORING DEVICE AND METHOD FOR OVERLOAD MONITORING

FIELD

The present invention relates to an overload monitoring device for an electrical system as well as a method for monitoring the overload of an electrical system.

BACKGROUND INFORMATION

In many electrical systems, it is necessary to protect parts of the system or the entire system against electrical overload. For this purpose, for example, fuses are used in many forms in low voltage systems. Such fuses have characteristic $I^2t$ curves, as shown in FIG. 1, or time-current characteristic curves, as shown in FIG. 2, including a continuous curve. From the characteristic curves, it is apparent that the cutoff current or its level is not actually responsible for the cutoff of the fuse, but instead is due to a power supplied during a defined period of time.

SUMMARY

According to the present invention, an overload monitoring device for an electrical system is provided, including a measuring device for current and/or voltage, a time measuring device and an evaluation device connected to the measuring device and the time measuring device being provided, the evaluation device being designed for generating parameters from measured values of the measuring device and/or for detecting an overload situation based on the measured values and/or the parameters using time data of the time measuring device.

The electrical system may include a line network used for energy transmission such as a supply line, the components such as consumers or loads connected to it and/or circuit elements or measuring devices. In order to be able to monitor and also to protect all, multiple, or individual components, the present invention proposes to adjust parameters and/or characteristic curves of the overload monitoring device to the behavior of the consumer and/or the capabilities of the energy transmission network. This allows an optimal protection of the electrical system. In a particularly advantageous manner, the present invention allows a monitoring and/or shut-off, based on freely definable parameters which are also optionally changeable over time, the parameters not being dependent on the geometry of the protective device such as a fuse, but being instead optimized for the electrical system to be monitored.

Advantageously, the parameter includes at least one value from the group of current, voltage, power, energy, as well as slew rates, derivations, integrals and averages of these variables. Parameters are understood to be, for example, the above variables; thereby, the measured value current may become the parameter current, in that the resolution over time of the pure measured value is adjusted or processed or only a certain point in time or a time interval is considered.

Multiple parameters may form a characteristic curve or cutoff characteristic curve, it being possible for transitions of the characteristic curve to be discontinuous. This characteristic curve defines the boundary between a safe operating range and an overload range, so that protective measures are taken when the characteristic curve is reached. The transition between areas of the characteristic curve may be discontinuous. For example, different parameters may be considered for different ranges, which may occur sequentially over time or assigned to operating states. This makes it possible to model the monitoring to actual situations of the system to be monitored.

In one specific embodiment, it is provided that a separator connected to the evaluation device is provided in a supply line to the electrical system or in a supply line of the electrical system, which is activatable by the evaluation device for disconnecting the supply line when an overload situation is detected. The separator, for example, a circuit breaker such as a semiconductor switch, allows the transition from a pure monitoring to a protection by shutting off overcurrents and outputs.

It is also possible that the measuring device is situated on the output side and/or input side of the separator. The position may be optimized depending on the application.

According to one preferred specific embodiment of the present invention, a semiconductor switch is designed as a separator and as a measuring device in such a way that a voltage drop is measured across the conduction resistor of the semiconductor switch. This increased integration density allows the monitoring device to be made smaller.

An example method according to the present invention for overload monitoring of an electrical system basically includes the following steps:
  determining measured values for a current and/or a voltage of the electrical system;
  determining time data;
  generating parameters based on the measured values;
  detecting an overload situation based on the measured values and/or the parameters using the time data.

The same advantages and modifications as described above are applicable. The parameters may be generated using the time data.

It may be advantageously provided that a cutoff characteristic curve is ascertained from the parameters, the cutoff characteristic curve having multiple areas including different monitored measured values and/or parameters. The areas allow the monitoring and/or shut-off to be optimally adjusted to the system to be monitored.

Changes over time of the electrical system may be included in the parameters. This allows a dynamic adjustment of the characteristic curve and/or the parameters. This makes it possible to intercept changes of the electrical system over time, without the monitoring drawing false conclusions. For example, changes such as wear and tear may thus be considered over the service life.

Multiple parameters may be monitored in parallel over time and/or for certain operating states for the detection. This may result in a monitoring matrix and/or a set of characteristic curves, which makes a multi-dimensional monitoring possible.

Advantageous refinements of the present invention are explained herein.

BRIEF DESCRIPTION OF THE DRAWINGS

Exemplary embodiments of the present inventions are depicted in the figures and explained in greater detail below.

DETAILED DESCRIPTION OF THE INVENTION

Figure 1:
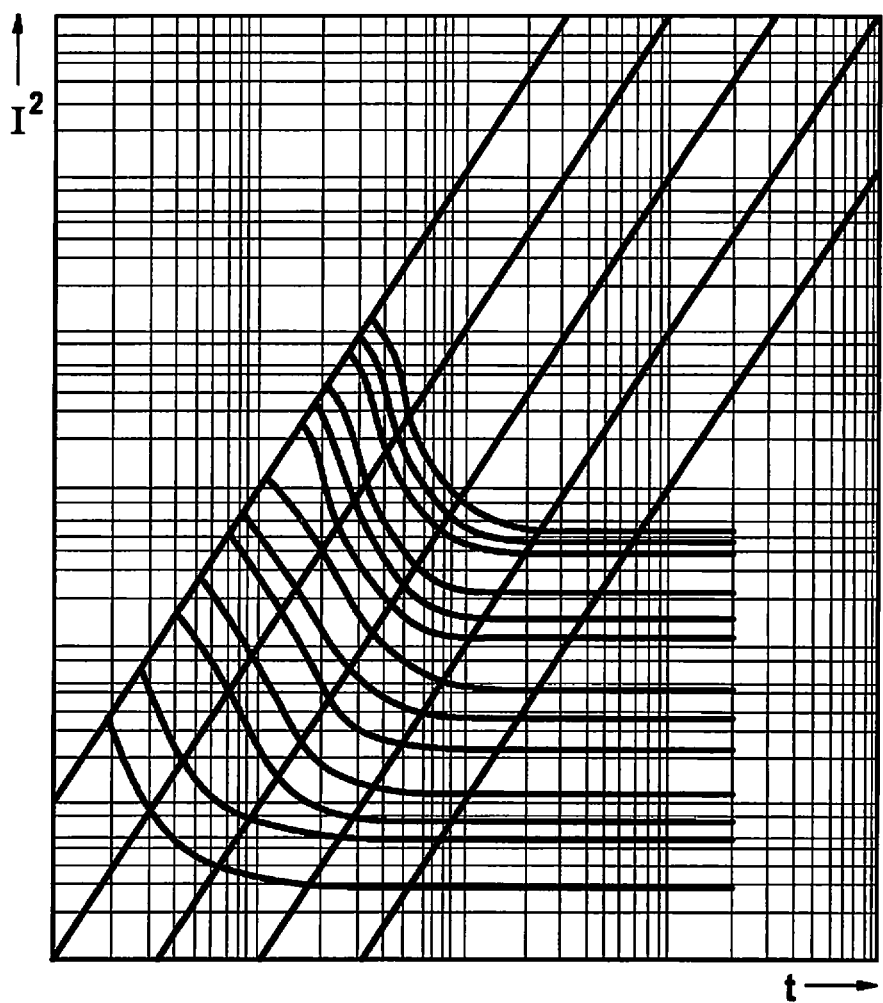
FIG. 1 shows a diagram including $I^2t$ characteristic curves of a known fuse.
Figure 2:
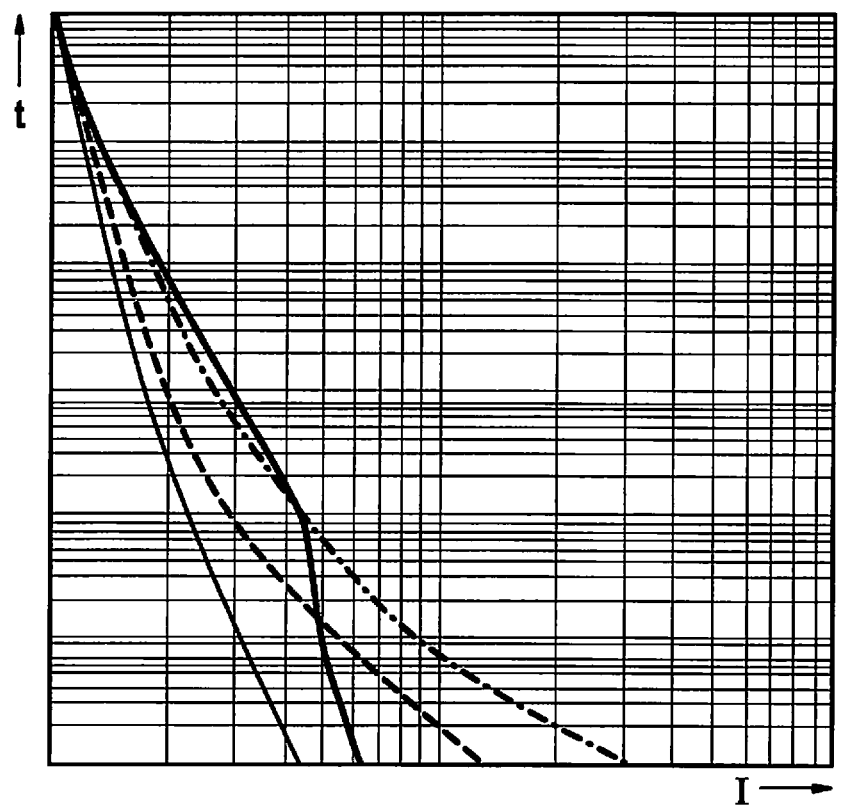
FIG. 2 shows a diagram including time-current characteristic curves of a conventional fuse.
Figure 3:
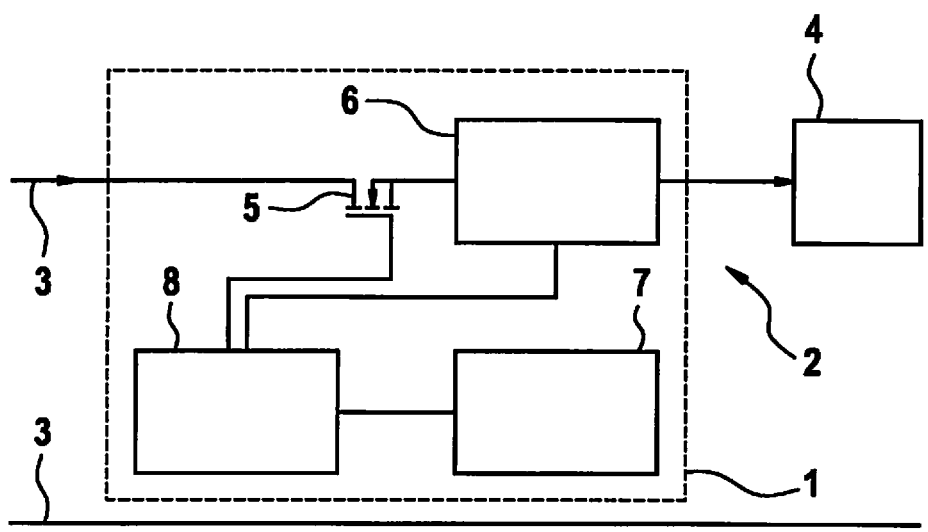
FIG. 3 shows a schematic representation of an overload monitoring device for an electrical system according to the present invention.

An overload monitoring device or an overload cutoff device 1 for an electrical system 2 is shown in FIG. 3. Electrical system 2 includes at least one electrical supply line 3 and one consumer or one load 4. A separator 5, for example, in the form of a circuit breaker is implemented in supply line 3. The circuit breaker may, for example, be designed as a MOSFET or as an IGBT (insulated-gate bipolar transistor). In particular, the circuit breaker may be made up of two anti-serial MOSFETs.

Separator 5 may be an integral part of electrical system 2, which means that separator 5 is also monitored, and/or separator 5 may be an integral part of overload monitoring device 1. Overload monitoring device 1 includes a measuring device 6 for current and/or voltage on supply line 3. The measuring device is represented here on the output side of separator 5, i.e., between separator 5 and consumer 4. Alternatively, measuring device 6 may also be situated on the input side of separator 5. It is also possible that two measuring devices 6 are provided, in which case one is situated on the input side, and the other is situated on the output side.

Furthermore, overload monitoring device 1 includes a time measuring device 7. Time measuring device 7 allows an absolute and/or relative determination of points in time and/or time intervals.

An evaluation device 8 of overload monitoring device 1 is connected to measuring device 6 in order to take over measured values of measuring device 6. Furthermore, evaluation device 8 is connected to time measuring device 7 in order to take on time information. In addition, evaluation device 8 is connected to separator 5 in order to control it. Time measuring device 7 may be integrated into evaluation device 8. In particular, integration into an ASIC (application-specific integrated circuit) or a microcontroller may be provided.

Evaluation device 8 is designed for generating parameters from the measured values of measuring device 6. Thus, for example, the power, the derivation and/or an integral of the current may be calculated from a current measured value of measuring device 6 in evaluation device 8. In addition, parameters of the measured value may be calculated taking into account a time period or a point in time, the time information originating from time measuring device 7. Thus, for example, average powers over different time periods may be calculated from a current measured value.

From the parameters, evaluation device 8 is able to determine characteristic curves or cutoff characteristic curves. The cutoff characteristic curves may be determined by, among other things, the evaluation of an optimum filter of the current and/or power. An optimum filter is a filter that optimizes the signal-to-noise ratio. The cutoff characteristic curve shape may also be determined by the evaluation of multiple optimum filters or, of optimum filters of the current, which are changeable over time, and/or the power.

The monitoring or cutoff of overcurrents and powers is described in greater detail below with reference to FIGS. 4 through 6.

Figure 4:
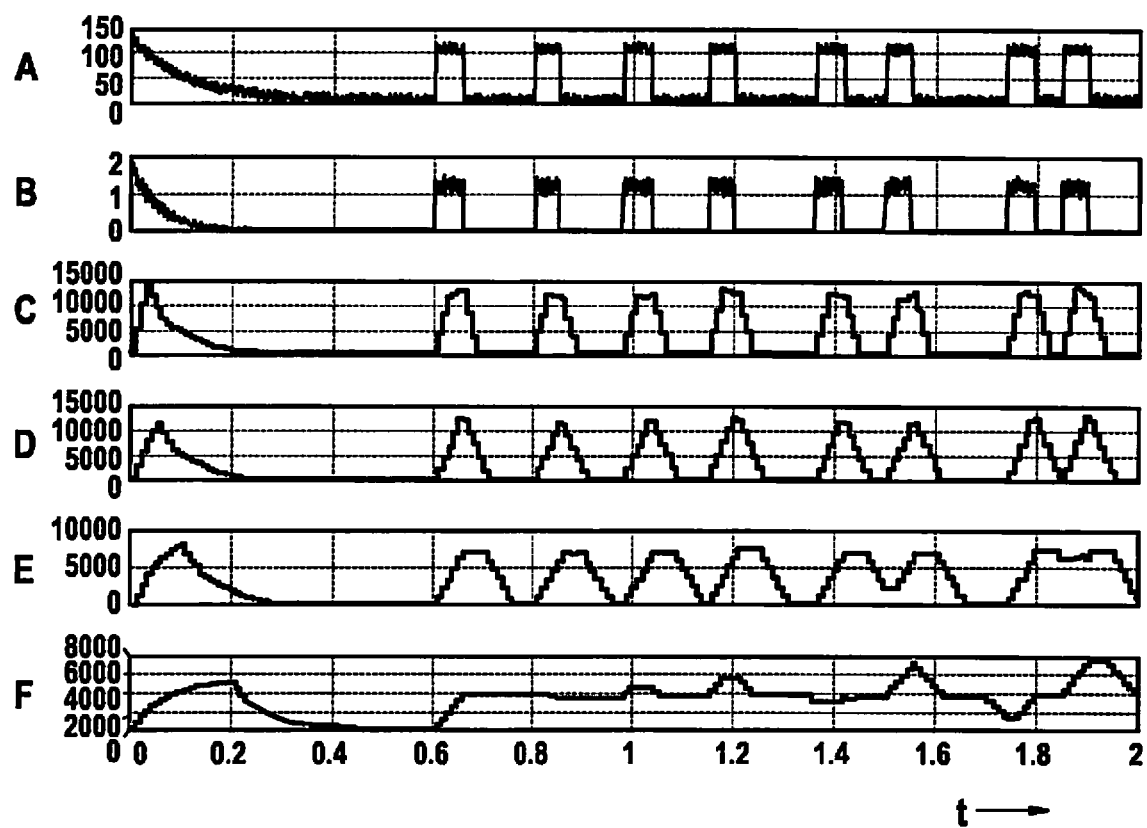
FIG. 4 shows a diagram including multiple measured values or parameters of the overload monitoring device.

FIG. 4 shows a diagram including multiple characteristic curves of an electrical system 2 having a high capacitive component, for example, a light bulb. The characteristic curves are plotted against time. Uppermost characteristic curve A corresponds to the measured current, second uppermost characteristic curve B corresponds to the power, third characteristic curve C corresponds to the average power over three clock cycles, fourth characteristic curve D corresponds to the average power over five clock cycles, fifth characteristic curve E corresponds to the average power over ten clock cycles and last characteristic curve F corresponds to the average power over twenty clock cycles.

After decay of the inrush current, which is the case at approximately 0.6 milliseconds (ms), the consumer is operated clocked. In this example, an error or overload case is present at approximately 1.8 milliseconds (ms). Neither via the absolute value of the current (characteristic curve A) nor via the instantaneous power (characteristic curve B) or the average powers over three, five and ten clock cycles (characteristic curves C, D, E) is the error apparent. Only the integral evaluation of the power over the period of twenty clock cycles makes the overload visible or evaluable above a threshold value or a characteristic curve (characteristic curve F). In this case, where, for example, a line was used, which is designed for the average value of the current, it is possible for an overload of the line to occur as a result of an unfavorable selection of the pulse-pause ratio. If only the measured value is considered, i.e., the actual current profile, this overload is not detected. Only an adjusted averager for the power (characteristic curve F) makes it possible to detect an overload situation. In a detected overload situation, evaluation device 8 activates separator 5, so that consumer or load 4 is disconnected from supply line 3.

Figure 5:
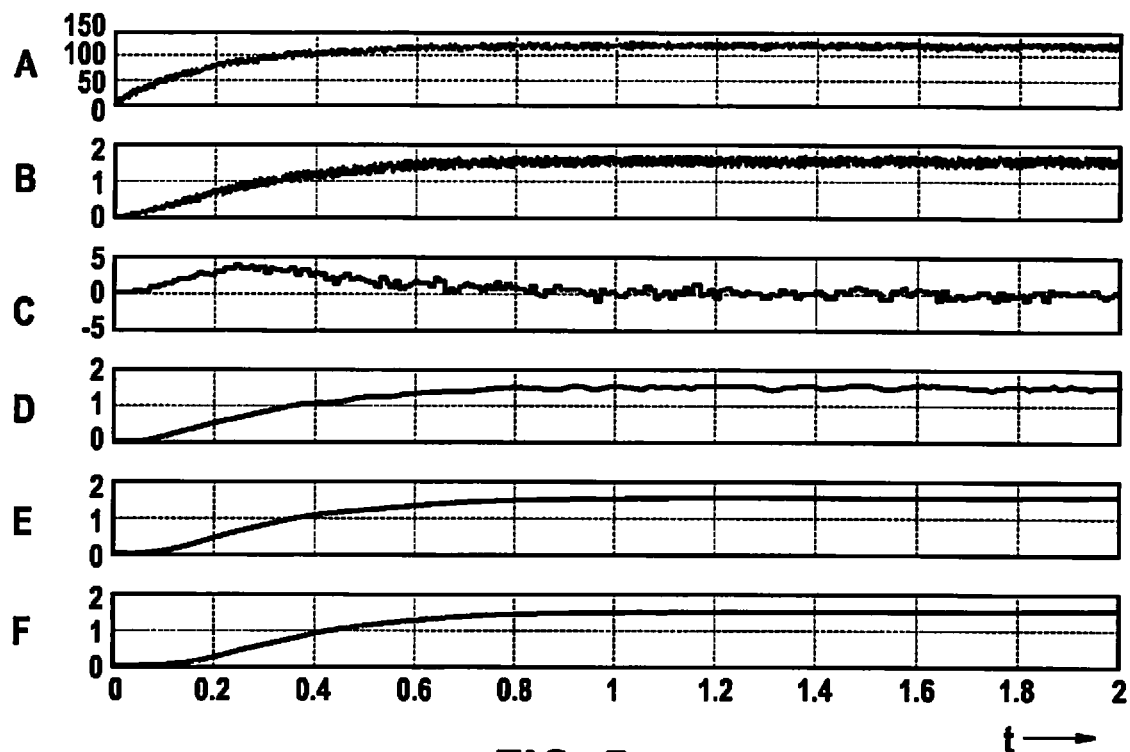
FIG. 5 shows a diagram including additional measured values or parameters of the overload monitoring device.

In comparison, FIG. 5 in turn shows six characteristic curves A through F for another electrical system 2 having a high inductive component. Here the slow rise in the current (characteristic curve A) and the power (characteristic B) is apparent. Characteristic curve C shows the time derivative of the power averaged over twenty clock cycles, while characteristic curve D shows the average power over five clock cycles, characteristic curve E shows the average power over 10 clock cycles and characteristic curve F shows the power averaged over 20 clock cycles. For the operating range or time segment represented in characteristic curves A through F from FIG. 5, no errors or overloads are present. The characteristic curves shown here may thus, for example, be used as reference characteristic curves.

Figure 6:
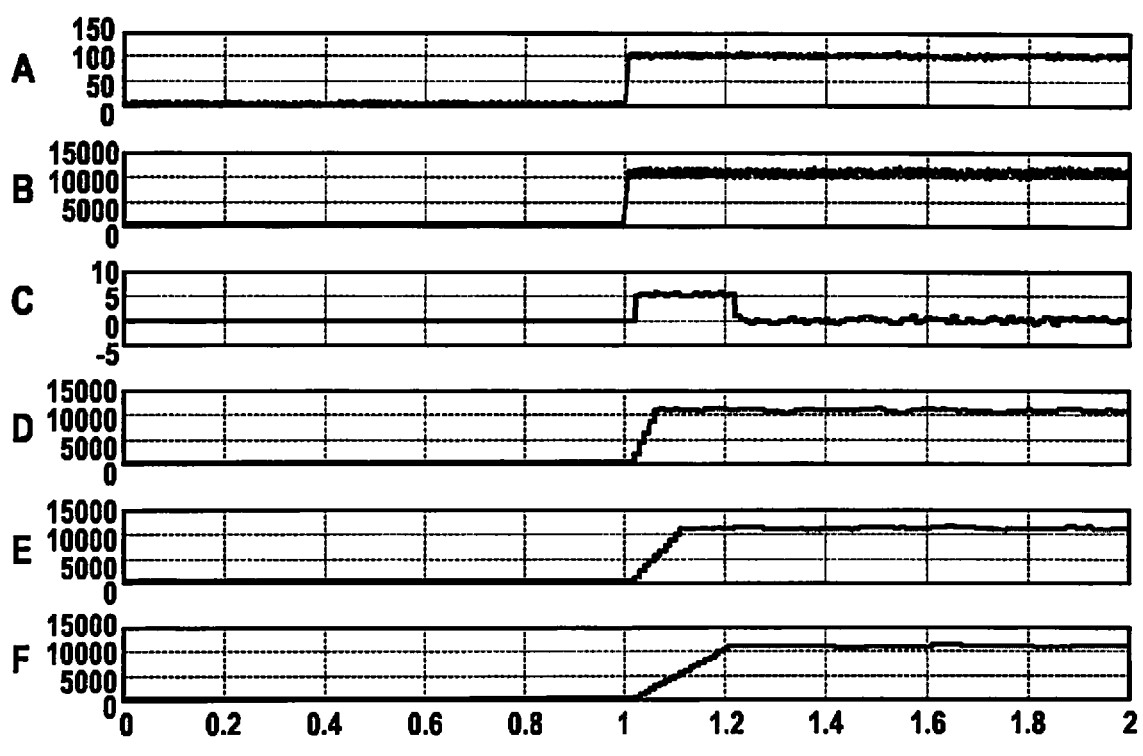
FIG. 6 shows a diagram including still additional measured values or parameters of the overload monitoring device.

Diagrams similar to the diagrams of FIG. 5 are shown in FIG. 6. Characteristic curves A through F now show a changed switch-on behavior, which, for example, was caused by a short circuit within the supply line to the consumer. Depending on the remaining line length and thus the line inductance, a rapid current increase and a maximum current now occurs. In this example shown, neither the maximum current (characteristic curve A) nor the maximum power (characteristic curve B) or the averaged power outputs (curves D, E, F) are a clear indication of an overload case. Only the current or power rate of increase (characteristic curve C), in this case, the derivation of the average power over twenty clock cycles, provides an adequate cutoff criterion for a safe and sufficiently rapid cutoff request.

As described above, the measurements of measuring devices 6 are considered time-resolved and the selection of the evaluation method of the parameter or the selection of the parameter derived from the measured variable is adjusted to electrical system 2 to be monitored. In addition, different areas or sections may be defined, for example, for a switch-on operation, the ongoing operation or a switch-off operation. Also, it is possible to optimize the parameters or the characteristic curves for different components of electrical system 2 to be monitored. Thus, it may be necessary or desirable, for example, to protect the switch or separator 5 at a first point in time, which, optimally, takes place as the result of an evaluation of the current and the voltage. At a second point in time, it may be important that supply line 3 is protected, which advantageously takes place by monitoring the current and the time. Parallel to the first two points in time or at a third point in time or period, it may be important that consumer 4 of the electrical system is monitored. This takes place optimally by monitoring of parameters, which are based on the voltage, the current and the time.

What is claimed is:

1. An overload monitoring device for an electrical system, comprising:
    a measuring device to measure at least one of a current and a voltage of the electrical system;
    a time measuring device connected to the measuring device;
    an evaluation device connected to the measuring device and the time measuring device, the evaluation device being configured for: i) generating parameters from measured values of the measuring device, ii) detecting an overload situation based on the measured values, and iii) detecting an overload situation based on the parameters, using time data of the time measuring device; and
    a separator provided in a supply line of the electrical system, the separator being activatable by the evaluation device for disconnecting the supply line when an overload situation is detected;
    wherein the evaluation device is connected to the measuring device to obtain the measured values of the measuring device, wherein the evaluation device is connected to the time measuring device to obtain the time data, and wherein the evaluation device is connected to the separator to control the separator,
    wherein the evaluation device is configured to determine a cutoff characteristic curve based on the parameters, wherein the cutoff characteristic curve is determined by evaluating at least one optimum filter of the current and/or a power, wherein the optimum filter is a filter that optimizes a signal-to-noise ratio,
    wherein the separator is connected in series to the measuring device and is coupled to and controlled by the evaluation device,
    wherein the separator includes a circuit breaker having at least one of a MOSFET, an IGBT, and two anti-serial MOSFETs, and
    wherein the time measuring device allows an absolute and/or relative determination of points in time and/or time intervals.

2. The overload monitoring device as recited in claim 1, wherein the parameters includes at least one value from the group of current, voltage, power, energy, slew rates, derivations, integrals, and averages of these variables.

3. The overload monitoring device as recited in claim 1, wherein multiple ones of the parameters form a characteristic curve.

4. The overload monitoring device as recited in claim 3, wherein transitions of the characteristic curve are discontinuous.

5. The overload monitoring device as recited in claim 1, wherein the measuring device is situated on at least one an output side of the separator and an input side of the separator.

6. A method for overload monitoring of an electrical system, comprising:
    determining, via a measuring device, measured values for at least one of a current and a voltage, of the electrical system;
    determining, via a time measuring device, time data; and
    performing, via an evaluation device: i) generating parameters from measured values of the measuring device, ii) detecting an overload situation based on the measured values, and iii) detecting an overload situation based on the parameters, using time data of the time measuring device;
    wherein a separator is provided in a supply line of the electrical system, the separator being activatable by the evaluation device for disconnecting the supply line when an overload situation is detected,
    wherein the evaluation device is connected to the measuring device to obtain the measured values of the measuring device, wherein the evaluation device is connected to the time measuring device to obtain the time data, and wherein the evaluation device is connected to the separator to control the separator, and
    wherein the evaluation device is configured to determine a cutoff characteristic curve based on the parameters, wherein the cutoff characteristic curve is determined by evaluating at least one optimum filter of the current and/or a power, wherein the optimum filter is a filter that optimizes a signal-to-noise ratio,
    wherein the separator is connected in series to the measuring device and is coupled to and controlled by the evaluation device,
    wherein the separator includes a circuit breaker having at least one of a MOSFET, an IGBT, and two anti-serial MOSFETs, and
    wherein the time measuring device allows an absolute and/or relative determination of points in time and/or time intervals.

7. The method as recited in claim 6, wherein a cutoff characteristic curve is ascertained from the parameters, the cutoff characteristic curve having multiple areas including at least one of different monitored measured values and parameters.

8. The method as recited in claim 6, wherein changes over time of the electrical system are included in the parameters.

9. The method as recited in claim 7, wherein multiple parameters are monitored in parallel at least one of over time and for certain operating states for the detection.

* * * * *